United States Patent [19]

Ohtoshi et al.

[11] Patent Number: 5,042,049
[45] Date of Patent: Aug. 20, 1991

[54] SEMICONDUCTOR OPTICAL DEVICE

[75] Inventors: Tsukuru Ohtoshi, Kokubunji; Shinji Sakano; Kazuhisa Uomi, both of Hachioji; Naoki Chinone, Chofu, all of Japan

[73] Assignee: Hitachi, Ltd., Tokyo, Japan

[21] Appl. No.: 461,253

[22] Filed: Jan. 5, 1990

[30] Foreign Application Priority Data

Jan. 10, 1989 [JP] Japan ................................. 1-1391

[51] Int. Cl.$^5$ ............................................. H01S 3/19
[52] U.S. Cl. ............................................. 372/45; 372/46; 372/50; 372/96
[58] Field of Search ..................... 372/45, 46, 50, 96

[56] References Cited

U.S. PATENT DOCUMENTS

| 4,737,003 | 4/1988 | Matsumura et al. | 350/96.14 |
| 4,755,015 | 7/1988 | Uno et al. | 372/50 |
| 4,840,446 | 6/1989 | Nakamura et al. | 350/96.13 |
| 4,852,108 | 7/1989 | Utaka et al. | 372/50 |
| 4,873,691 | 10/1989 | Uomi et al. | 372/50 |

FOREIGN PATENT DOCUMENTS 0242049 7/1985 Japan .

OTHER PUBLICATIONS

Adams, "Band-Structure Engineering for Low Threshold High-Efficiency Semiconductor Laser," Electronics Lett., Feb. 27, 1986, vol. 22, No. 5, pp. 249-250.
Nonlinear Effects in Coplanar . . . Appl. Phys. Lett. 51, 11/23/87.
Low-loss Short-Wavelength . . . Appl. Phys. Lett. 52, 1/11/88.
Avalanche Gain in . . . IEEE Elec. Dev. Letts., vol. EDL-7, No. 5/86.
High Performance Tunable . . . Appl. Phys. Lett. 53, 9/19/88.
Properties of In$_x$ . . . J. Appl. Phys. 57, 1/1/85.
Single Frequency . . . Jour. Lightwave Tech., vol. 6, 11/11/88.

Primary Examiner—Georgia Epps
Attorney, Agent, or Firm—Antonelli, Terry, Stout & Kraus

[57] ABSTRACT

A semiconductor optical device in which an optical waveguide (3, 11) provided on a semiconductor substrate (1) comprises a strained-layer superlattice shows an extremely small transmission loss. A semiconductor optical device with further improved characteristics is obtainable by using a stained-layer superlattice for a portion required to show a great change in refractive index, such as an optical crosspoint switch portion (10), as well as for the optical waveguide (3, 11). The strained-layer superlattice comprises a first semiconductor layer and a second semiconductor layer having a narrower band gap and a greater lattice constant as compared with the first semiconductor layer, the two layers grown periodically.

16 Claims, 4 Drawing Sheets

SEMICONDUCTOR OPTICAL DEVICE

BACKGROUND OF THE INVENTION

This invention relates to semiconductor optical devices such as optical switchboards in an optical communication systems, optical modulators used as light sources for transmission and local oscillation, optical switches, semiconductor lasers, etc., and more particularly to a semiconductor optical device comprising an improved optical waveguide.

Of various semiconductor optical devices, the semiconductor laser has been described in many publications, for instance, Electronics Letters, Vol. 22, No. 5, pp. 249–250 (1986) by A. R. Adams. The publication includes a qualitative discussion on the use of a strained-layer superlattice for an active layer of a semiconductor laser to achieve a decrease in intervalence band absorption. It is possible, by use of a strained-layer superlattice for the active layer of a semiconductor laser, to reduce the threshold current of the laser and to increase the modulation rate. In the description of the publication, however, the strained-layer superlattice is used only for the active layer.

Carrier injection type optical switches, also, have been described in a number of publications, for instance, Japanese Patent Application Laid-Open (KOKAI) No. 60-134219 (1985). The carrier injection type optical switch described in the publication comprises an optical waveguide using a bulk crystal. U.S. Pat. No. 4,737,003 corresponds to the Japanese Patent Application Laid-Open (KOKAI) No. 60-134219 (1985).

Furthermore, Japanese Patent Application No. 61-215806 (1986) discloses an optical waveguide using a superlattice. In this case, however, the superlattice has lattice matching and is not a strained-layer superlattice. While InGaAsP/InP, for example, is generally used for the superlattice in the prior art mentined above, the InGaAsP layer is in lattice matching with the InP layer, and the superlattice is not a strained-layer superlattice.

InGaAsP/InP is used as a semiconductor laser material conforming to a wavelength used for optical communication, for instance, 1.3 $\mu$m or 1.55 $\mu$m. InGaAsP is used for the active layer, and InP for the substrate or the cladding layer of the semiconductor laser. In addition, avalanche photodiodes (APD) are also produced using InGaAsP/InP. Thus, an InGaAsP/InP system is used in most of semiconductor optical devices which are now in practical use for optical communication. In all these semiconductor optical devices, however, the InGaAsP layer and the InP layer are in lattice matching with each other, and are not provided as a strained-layer system.

FIG. 2 is a diagram illustrative of the band structure of the above-mentioned InGaAsP/InP used as a conventional optical waveguide.

In this material system, the curvature of the heavy-hole band is small, as shown in FIG. 2. The holes are therefore distributed also in the region of greater wave numbers, as shown in FIG. 2, so that electrons in the split-off band will be easily excited by optical absorption. Accordingly, the optical absorption between the split-off band and the heavy-hole band, namely, the intervalence band absorption is large, and the absorption is conspicuous especially in longer wavelength regions. Besides, a large loss due to the absorption in a higher hole concentration layer has been the cause of a reduction in the performance of carrier injection type optical modulators, semiconductor lasers with an external cavity, wavelength-tunable semiconductor lasers, etc.

Moreover, the small curvature of the heavy-hole band, as shown in FIG. 2, means a high density of states. Upon carrier injection, therefore, the change in the carrier energy distribution (called "the band-filling effect") is slight, and the change in refractive index is small. Accordingly, it is necessary to reduce the angle of the optical waveguide intersection in an optical crosspoint switch, with the result of a greater device width or a closer arrangement of the optical waveguides, leading to the generation of crosstalk.

SUMMARY OF THE INVENTION

This invention comtemplates overcoming the above-mentioned drawbacks or difficulties involved in the prior art.

It is an object of this invention to provide an optical waveguide showing an extremely low loss, by reducing the intervalence band absorption and/or by increasing the change in refractive index due to carrier injection.

It is another object of this invention to provide a high-performance semiconductor optical device, such as an optical modulator, an optical switch, a semiconductor laser, etc. which comprises the above-mentioned optical waveguide.

A major feature of this invention lies in that the optical waveguide for conducting light is provided using a strained-layer superlattice, in order to attain the above objects.

According to this invention, there is provided a semiconductor optical device comprising an optical waveguide on a semiconductor substrate, characterized in that the optical waveguide has a strained-layer superlattice comprising a first semiconductor layer and a second semiconductor layer which are grown alternately or periodically, the second semiconductor layer having a narrower band gap and a greater lattice constant as compared with the first semiconductor layer.

There is also provided, according to this invention, a semiconductor optical device having a semiconductor laser which comprises, on a semiconductor substrate, an active region having an active layer for emitting light, a wavelength control region having an optical waveguide for conducting the light, the optical waveguide disposed in continuity with the active layer in the optical axis direction, means for injecting a current into the active region, and means for injecting a current into the wavelength control region, characterized in that the optical waveguide has a strained-layer superlattice comprising a first semiconductor layer and a second semiconductor layer which are grown alternately or periodically, the second semiconductor layer having a narrower band gap and a greater lattice constant as compared with the first semiconductor layer.

The optical waveguide in this invention, which comprises the strained-layer superlattice on the semiconductor substrate as mentioned above, may optionally comprise a cladding layer on the upper surface and/or a side surface of the superlattice. In order to set the refractive index of the strained-layer superlattice layer to an appropriate value, means for applying a current to the superlattice layer is provided, naturally. The desirable value of the refractive index of the strained-layer superlattice layer depends on the kind of the semiconductor optical device comprising the superlattice layer. In general, however, a construction may be adopted such that the refractive index of the strained-layer superlattice layer upon application of a predetermined current to the superlattice layer is higher than the refractive indices of the substrate and the cladding layer by, for example, 5%.

As has been described above, the first and second semiconductor layers constituting the strained-layer superlattice layer in this invention have such lattice constants that $a_2 > a_1$, where $a_1$ and $a_2$ are the lattice constants of the first and second semiconductor layers, respectively. Let $\Delta a$ defined by the formula $\Delta a = 100(a_2 - a_1)/a_1$ be the lattice constant difference (%), then the lattice constants $a_1$ and $a_2$ are so set that $\Delta a$ is in the range of $0.5 < \Delta a < 4.0$ (%).

The thickness of the first semiconductor layer, the thickness of the second semiconductor layer, and the total number of the first and second semiconductor layers grown may be the same as in a conventional superlattice layer. Besides, the band gap of the first semiconductor layer, $Eg_1$, and the band gap of the second semiconductor layer, $Eg_2$, are in the relationship of $Eg_2 < Eg_1$, and the difference between $Eg_1$ and $Eg_2$ may be the same as in a conventional superlattice layer.

A III-V compound semiconductor is ordinarily used as a semiconductor for forming the semiconductor optical device of this invention, particularly for the first and second semiconductor layers constituting the strained-layer superlattice layer. However, semiconductors to be used in this invention are not limited to the III-V compound semiconductors.

It is a specific feature of the semiconductor optical device according to this invention that at least a part of the region playing a passive role (passive region), such as an optical waveguide, comprises a strained-layer superlattice, and the other components or constructions of the semiconductor optical device may be designed by application of the conventional knowledge in the art. It is natural, however, that other regions than the passive region may also be formed using a strained-layer superlattice, whereby a favorable effect is expected.

The above and other objects, features and advantages of this invention will become apparent from the following description and appended claims, taken in conjunction with the accompanying drawings which show by way of example some preferred embodiments of this invention.

BRIEF DESCRIPTION OF THE DRAWINGS

FIG. 4b is a sectional view taken along line A—A' of FIG. 4a;

FIG. 5b is a sectional view of a laser portion, taken in parallel to a plane perpendicular to the optical axis, of the semiconductor laser shown in FIG. 5a;

FIG. 5c is a sectional view of an external cavity portion, taken in parallel to a plane perpendicular to the optical axis, of the semiconductor laser shown in FIG. 5a.

DETAILED DESCRIPTION OF THE INVENTION

Figure 3:
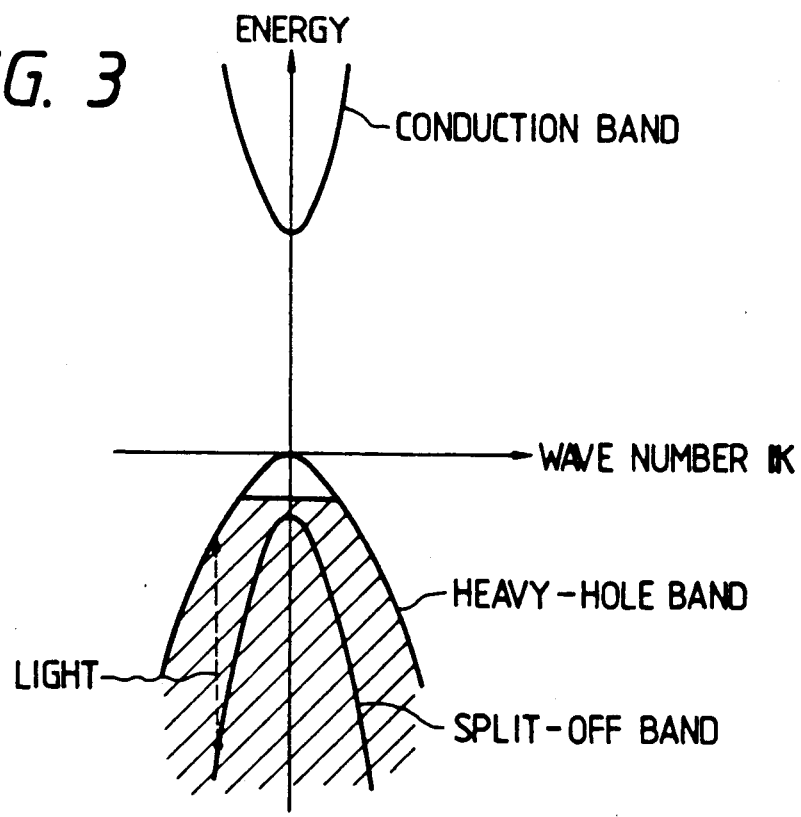
FIG. 3 is a diagram explanatory of the band structure of a quantum well layer in a strained-layer superlattice used in this invention.

The strained-layer superlattice to be introduced into the optical waveguide is formed by growing alternately a thin film of a first semiconductor and a thin film of a second semiconductor. The band gap $Eg_2$ of the second semiconductor layer (so-called quantum well layer) is set to be smaller than the band gap $Eg_1$ of the first semiconductor layer (so-called barrier layer), and the lattice constant $a_2$ of the second semiconductor layer is set to be greater than the lattice constant $a_1$ of the first semiconductor layer. That is, $Eg_2 < Eg_1$, and $a_2 > a_1$. With this construction, the well layer is compressed perpendicularly to the direction of growth of the layers, namely, in the plane of the superlattice. FIG. 3 is a diagram illustrative of the band structure of the well layer in the strained-layer superlattice in such a status. By way of explanation, light-holes are ignored, and only the lowest level sub-band is shown for heavy-holes. As shown in the diagram, the curvature of the heavy-hole band is enlarged in the well layer of the strained-layer superlattice, and the intervalence band absorption occurs at a considerably larger distance from the band edge (that is, wave number $K = 0$), as compared with the usual case. In addition, the holes themselves are concentrated on the vicinity of the band edge. Therefore, the hole density is considerably lowered in the region of wave number K in which the intervalence band absorption would occur; thus, the intervalence band absorption is suppressed. The above-mentioned is the reason for the low loss of the strained-layer superlattice, and constitutes a first feature of the strained-layer superlattice.

Furthermore, the large curvature of the heavy-hole band, as shown in FIG. 3, means a low density of states. Upon carrier injection, therefore, the change in the carrier energy distribution (the band-filling effect) is greater, and the change in refractive index is larger, as compared with the conventional superlattice or bulk. This is a second feature of the strained-layer superlattice.

Thus, the features of the strained-layer superlattice arise from the curvature of the heavy-hole band, and the change in the curvature is greater as the lattice constant difference between the well layer and the barrier layer, $\Delta a = 100(a_2 - a_1)/a_1$, is larger. Too large a difference in lattice constant, however, will cause the problem of crystal defects or the like. Therefore, it is desirable that $\Delta a$ be in the range of about $0.5 < \Delta a < 4.0\%$.

As described above, a strained-layer superlattice shows an extremely small loss due to intervalence band absorption. This ensures the low transmission loss in the optical modulator according to this invention which uses a strained-layer superlattice for the optical waveguide.

Transmission loss is also small in the semiconductor layer with external cavity according to the invention, which uses a strained-layer superlattice for the waveguide of the external cavity. It is therefore possible to increase the intensity of optical feedback from the external cavity to the laser portion, and to enlarge the length of the cavity, which leads to a smaller spectral line width as compared with the prior art.

Also, in a wavelength-tunable laser using a passive optical waveguide such as a DBR (Distributed Bragg Reflection) region, a reduction in loss is achievable together with improvements in such characteristics as spectral line width and oscillation efficiency.

In the semiconductor laser having the strained-layer superlattice active layer described in the above-mentioned publication by A. R. Adams, a large current flows through the superlattice. In the semiconductor laser of this invention using a strained-layer superlattice for the optical waveguide, on the other hand, it suffices to make a small current flow through the superlattice, which promises enhanced lifetime and reliability as compared with the semiconductor laser using the strained-layer superlattice active layer.

Furthermore, the device according to this invention shows a large change in refractive index due to carrier injection, as mentioned above. When the invention is applied to an optical crosspoint switch, therefore, it is possible to obtain a smaller switch region and a larger angle of optical waveguide intersection, leading effectively to a decrease in the device width and a reduction in crosstalk.

DESCRIPTION OF THE PREFERRED EMBODIMENTS

EXAMPLE 1

Figure 1:
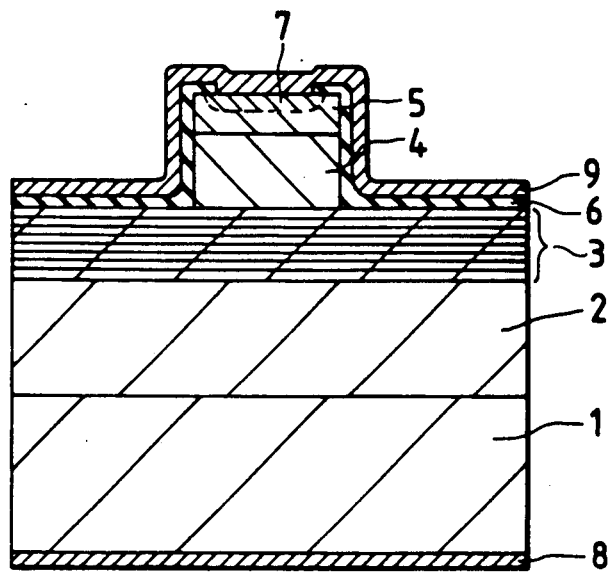
FIG. 1 is a sectional view of a carrier injection type optical modulator according to one embodiment of this invention.

FIG. 1 is a sectional view of a carrier injection type optical modulator according to a first embodiment of this invention.

The optical modulator comprises an n-type InP substrate 1, an n-type InP buffer layer 2, a strained-layer superlattice optical waveguide layer 3, a p-type InP cladding layer 4, a p-type InGaAsP cap layer 5, an SiO$_2$ insulator film 6, a Zn diffusion region (p-type region) 7, an n-type ohmic electrode 8, and a p-type ohmic electrode 9.

This optical device is produced as follows.

First, the n-type InP buffer layer 2 is grown on the n-type InP substrate 1 by the MOCVD (organometallic chemical vapor deposition) method. Next, a 70-Å thick In$_{0.8}$Ga$_{0.2}$As well layer (lattice constant 5.98 Å) and a 70-Å thick InP barrier layer (lattice constant 5.87 Å) are alternately grown for seven periods (or cycles) to provide the strained-layer superlattice optical waveguide layer 3. Thus, the lattice constant of the well layer is greater than the lattice constants of the InP substrate and the barrier layer by 1.9%. The band gap of the well layer, with the barrier layer disposed adjacent thereto and with a strain exerted thereto, is 0.52 eV and the band gap of the barrier layer is 1.35 eV.

Subsequently, the p-type InP cladding layer 4 with 0.5 μm thickness and the p-type InGaAsP cap layer 5 with 0.3 μm thickness are grown. The cap layer 5 and the cladding layer 4 are then selectively etched down to the strained-layer superlattice optical waveguide layer 3 by use of a photoresist mask and a mixed liquid of hydrochloric acid and nitric acid, thereby forming a ridge structure as shown. Thereafter, the SiO$_2$ film 6 is provided by the CVD method, and after providing a contact hole, selective diffusion of Zn is conducted to provide the Zn diffusion region 7.

Finally, the n-type ohmic electrode 8 and the p-type ohmic electrode 9 are provided by the vacuum deposition method, followed by cleavage to set the device length in the optical axis direction to 1 mm, and both cleavage surfaces are given an antireflection (AR) coating, to produce the carrier injetion type optical modulator according to the embodiment shown in FIG. 1. An AuGeNi/Au bilayer metallic electrode was used as the n-type electrode 8, and a Ti/Au bilayer metallic electrode was used as the p-type electrode 9.

The optical modulator of this example, produced as above, gave a transmission loss upon carrier injection of 10 dB/cm for an incident wavelength of 1.55 μm, and a phase control of $2\pi$ for an injection current of 30 mA.

In general, the transmission loss of a typical optical modulator with the conventional structure is about 30 dB/cm.

EXAMPLE 2

Figure 4A:
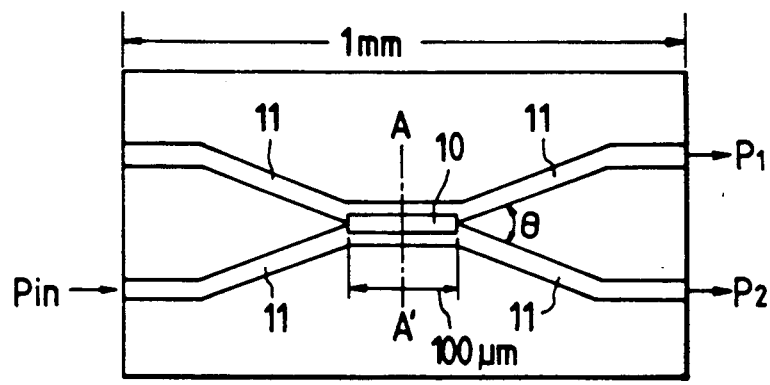
FIG. 4a is a plan view of an optical crosspoint switch according to another embodiment of this invention.
Figure 4B:
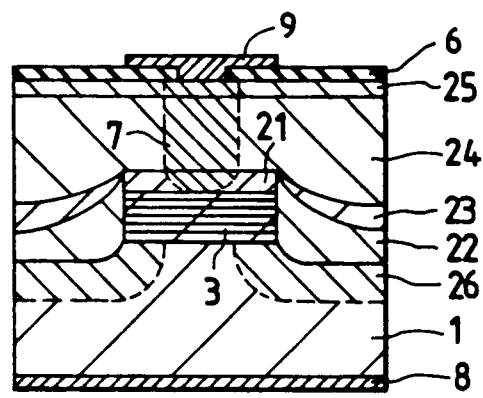

FIG. 4a is a plan view of an optical crosspoint switch according to a second embodiment of this invention, and FIG. 4b is a sectional view taken along line A—A' of FIG. 4a.

In FIG. 4a, numeral 10 denotes a total reflection type optical switch portion, and numeral 11 an optical waveguide portion. In FIG. 4b, there are shown an n-type InP substrate 1, a Zn diffusion region 26, a strained-layer superlattice optical waveguide layer 3, an n-type InP layer 21, a p-type InP buried layer 22, an n-type InP buried layer 23, a p-type InP layer 24, a Zn diffusion region 7, a p-type InGaAsP cap layer 25, an SiO$_2$ insulator film 6, an n-type ohmic electrode 8, and a p-type ohmic electrode 9.

This optical device is produced as follows.

First, selective Zn diffusion from the surface of the n-type InP substrate 1 is carried out to form the Zn diffusion region 26 with 1 μm thickness. Next, a 70-Å thick In$_{0.90}$Ga$_{0.10}$As$_{0.60}$P$_{0.40}$ well layer (band gap wavelength $\lambda_g=1.55$ μm, lattice constant 5.93 Å) and a 70-Å thick In$_{0.81}$Ga$_{0.19}$As$_{0.40}$P$_{0.60}$ barrier layer (band gap wavelength $\lambda_g=1.15$ μm, lattice constant 5.87 Å) are alternately grown for seven periods (or cycles) by the MOCVD method to provide the strained-layer superlattice optical waveguide layer 3.

Subsequently, the n-type InP layer 21 with 0.5 μm thickness is grown, and a 5-μm wide mesa (3 and 21) is formed. Then, the p-type InP buried layer 22 with 0.5 μm thickness, the n-type InP buried layer 23 with 0.3 μm thickness, the p-type InP layer 24 with 1 μm thickness and the p-type InGaAsP cap layer 25 with 0.3 μm thickness are respectively grown by the liquid phase epitaxy. Thereafter, the SiO$_2$ film 6 with 0.1 μm thickness is provided by the CVD method, and after providing a contact hole, selective Zn diffusion down to the strained-layer superlattice optical waveguide layer 3 is carried out, to produce the Zn diffusion region 7. Finally, the n-type electrode 8 and the p-type electrode 9, similar to those in Example 1, are provided by the vacuum deposition method.

As shown in FIG. 4a, the total length was set to 1 mm, the length of the switch portion was set to 100 μm, and the angle of intersection, $\theta$, was set to 12°.

In the structure of the optical crosspoint switch shown in FIG. 4b, a pnpn current block structure consisting of the p-type InP layer 24, n-type InP buried layer 23, p-type InP buried layer 22, Zn diffusion region 26 and n-type InP substrate is provided on either side of the optical waveguide layer 3, in order to concentrate currents on the optical waveguide layer 3. The Zn diffusion regions 26 and 7 are provided for confinement of currents.

The optical crosspoint switch of this example, produced as above, showed an extinction ratio of 40 dB for an incident wavelength of 1.55 μm, with a transmission loss of 10 dB/cm.

Generally, a representative optical crosspoint switch with the conventional structure has a total length of 1 mm, a switch portion length of 150 μm, an angle of intersection of 8°, an extinction ratio of about 10 dB, and a transmission loss of about 30 dB/cm.

EXAMPLE 3

Figure 5A:
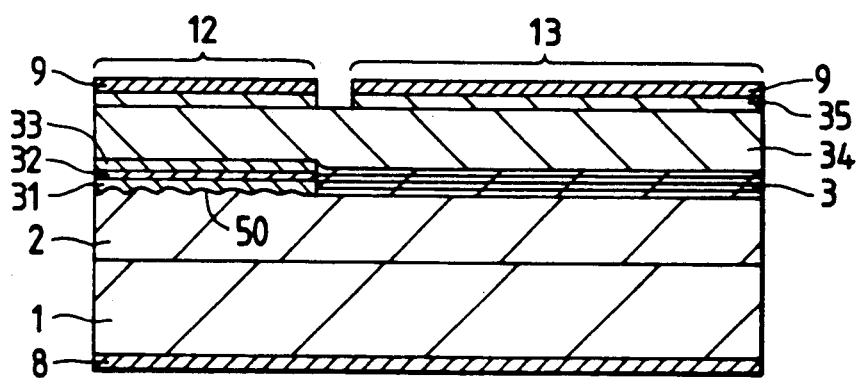
FIG. 5a is a sectional view, taken in parallel to the optical axis direction, of a semiconductor laser with external cavity according to a further embodiment of this invention.
Figure 5B:
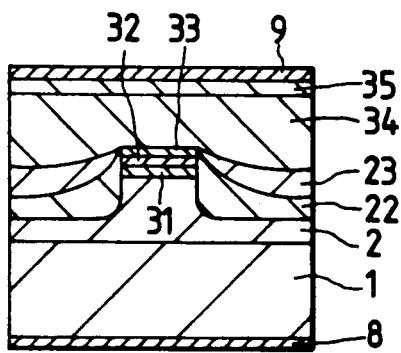
Figure 5C:
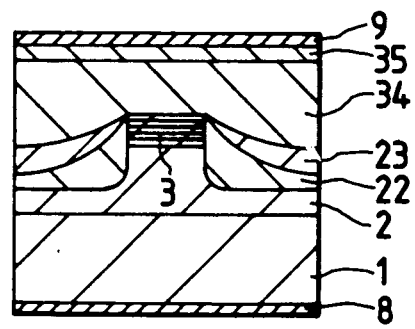

FIGS. 5a to 5c illustrate a semiconductor laser with external cavity according to a third embodiment of this invention, wherein FIG. 5a is a sectional view taken in parallel to the optical axis direction of the semiconductor laser, FIG. 5b is a sectional view of a laser portion 12, taken in a direction perpendicular to the optical axis, and FIG. 5c is a sectional view of an external cavity 13, taken in a direction perpendicular to the optical axis.

The semiconductor laser with external cavity comprises an n-type InP substrate 1, an n-type InP buffer layer 2, a strained-layer superlattice optical waveguide layer 3, a diffraction grating 50 provided on the upper side of the n-type InP buffer layer, an undoped InGaAsP layer 31, an MQW (multi quantum well) active layer 32, an undoped InGaAsP layer 33, a p-type InP cladding layer 34, a p-type InGaAsP cap layer 35, an n-type ohmic electrode 8, a p-type ohmic electrode 9, a p-type InP buried layer 22, and an n-type InP buried layer 23.

The diffraction grating 50, which is a sinusoidal grating with a height of 300 Å and a period of 240 nm, is necessary for oscillation of laser with a stable single spectrum. Only the light of a specified wavelength is reflected by the grating, according to the principle of Bragg reflection. The diffraction grating 50 is formed by a laser holographic technique. The diffraction grating is provided on the upper side and/or the lower side of the active layer.

This optical device is produced as follows.

First, the n-type InP buffer layer 2 is grown on the n-type InP substrate 1 by the MOCVD method. Next, the diffraction grating 50 with a ¼ shift of wavelength is provided on the upper side the n-type InP buffer layer 2. Then, the undoped InGaAsP layer 31 with 0.1 μm thickness, the MQW (multi quantum well) active layer 32 and the undoped InGaAsP layer 33 with 0.1 μm thickness are sequentially grown, again by the MOCVD method. The MQW active layer 32 comprises a 75-Å thick InGaAs well layer (band gap wavelength $\lambda_g = 1.65$ μm) and a 150-Å thick InGaAsP barrier layer (band gap wavelength $\lambda_g = 1.15$ μm) provided alternately, for five periods (or cycles).

Subsequently, those portions of the undoped InGaAsP layer 31, MQW layer 32 and undoped InGaAsP layer 33 which correspond to the region of the external cavity 13 are etched away, and the strained-layer superlattice optical waveguide layer 3 (having the same structure as in the above Examples) is grown only in the region of the external cavity 13 by again using the MOCVD method. After a mesa stripe is provided, as shown in FIGS. 5b and 5c, the p-type InP buried layer 22 with 1 μm thickness, the n-type InP buried layer 23 with 0.5 μm thickness, the p-type InP cladding layer 34 with 1.5 μm thickness, and the p-type InGaAsP cap layer 35 with 0.3 μm thickness are grown by the liquid phase epitaxy. The n-type electrode 8 and the p-type electrode 9, the same as in Example 1, are provided by the vacuum deposition method. For electrical separation between the laser portion 12 and the external cavity 13, those portions of the p-type electrode 9 and the p-type InGaAsP cap layer 35 which lie between the two regions are etched away. Finally, after cleavage for setting the length of the laser portion 12 to 300 μm and the length of the external cavity 13 to 5 mm, an antireflection (AR) coating and a high reflection (R) coating are applied to the end face on the side of the laser portion 12 and the end face on the side of the external cavity 13, respectively, to produce the semiconductor laser of this example.

In the structure of the semiconductor laser with external cavity shown in FIGS. 5a to 5c, the p-type InP buried layer 22 and the n-type InP buried layer 23 are provided to form a pnpn current block structure on either side of the mesa stripe. The undoped InGaAsP layer 31 and the undoped InGaAsP layer 33 are necessary for confinement of light in the MQW active layer 32, whereas the p-type InGaAsP cap layer 35 is necessary for obtaining ohmic contact.

The semiconductor laser of this example gives a spectral line width of 200 kHz at an optical output of 5 mW.

EXAMPLE 4

Figure 6:
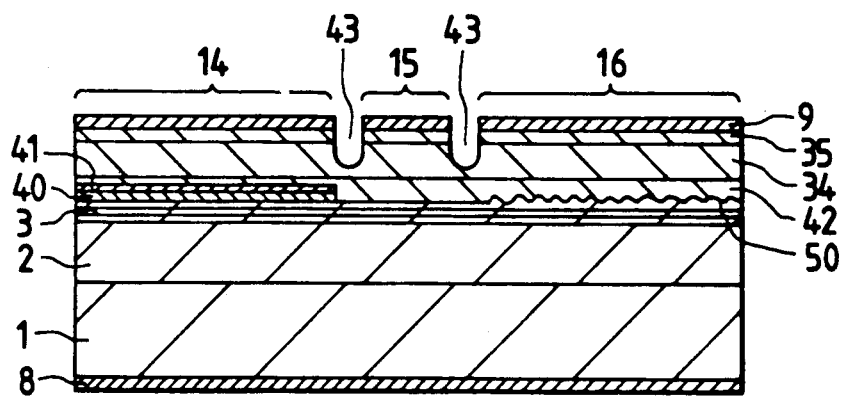
FIG. 6 is a sectional view, taken in parallel to the optical axis direction, of a wavelength-tunable semiconductor laser according to a still further embodiment of this invention.
Figure 2:
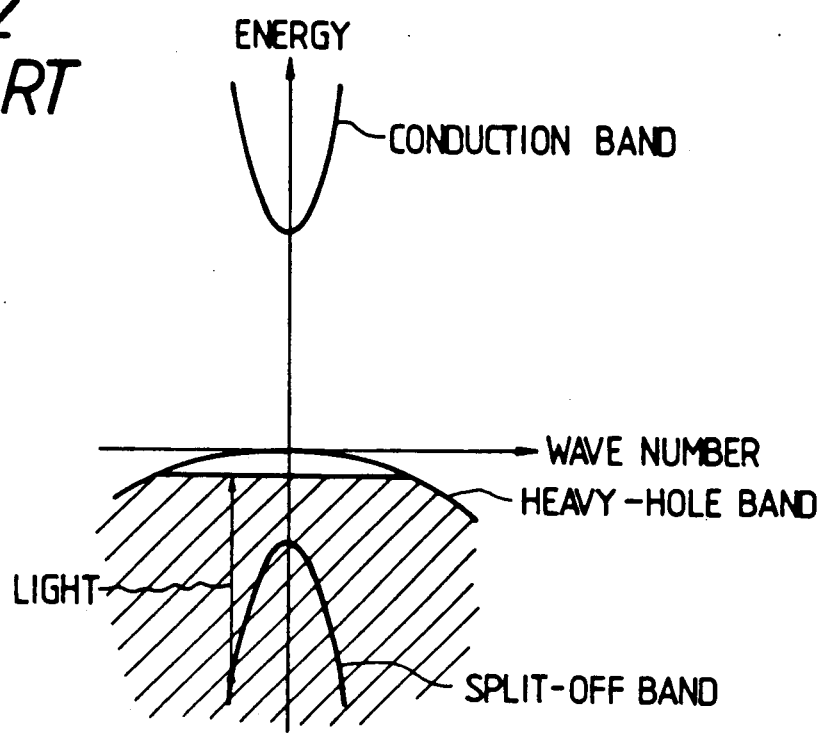
FIG. 2 is a diagram illustrative of the band structure of the material system constituting a superlattice used for an optical waveguide according to the prior art.

FIG. 6 is a sectional view, taken in parallel to the optical axis direction, of a wavelength-tunable semiconductor laser according to a fourth embodiment of this invention.

The semiconductor laser comprises an n-type InP substrate 1, an n-type InP buffer layer 2, a strained-layer superlattice optical waveguide 3, an InGaAsP active layer 40, an undoped InGaAsP layer 41, a diffraction grating 50 formed on the upper side of the optical waveguide 3, a p-type InP layer 42, a p-type InP cladding layer 34, a p-type InGaAsP cap layer 35, an n-type ohmic electrode 8, a p-type ohmic electrode 9, and grooves 43, numeral 14 denoting an active region, numeral 15 a phase control region, and numeral 16 a DBR region.

This optical device is fabricated as follows.

First, the n-type InP buffer layer 2, the strained-layer superlattice optical waveguide layer (with the same structure as in the above Examples) 3, the InGaAsP active layer (band gap wavelength $\lambda_g = 1.53$ μm) 40 with 0.1 μm thickness, and the undoped InGaAsP layer (band gap wavelength $\lambda_g = 1.27$ μm) 41 with 0.1 μm thickness are grown on the n-type InP substrate 1 by the MOCVD method. Of the InGaAsP active layer 40 and the InGaAsP layer 41, the portions outside the active region are etched away. Next, the diffraction grating 50 is formed on the upper side of the strained-layer superlattice optical waveguide layer 3 in correspondence with the DBR region, and the p-type InP layer 42 with 0.3 μm thickness is grown by again using the MOCVD method.

Subsequently, after a mesa stripe is provided in the same manner as in the third embodiment (refer to FIGS. 5a and 5b), a p-type InP buried layer (22), an n-type InP buried layer (23), the p-type InP layer 34 with 1 μm thickness, and the p-type InGaAsP cap layer 35 with 0.3 μm thickness are grown to form an ordinary hetero structure. After formation of the n-type electrode 8 and the p-type electrode 9 by the vacuum deposition method, the two grooves 43 are formed as shown in FIG. 6. The grooves 43 have a width of 10 μm and a depth of 0.7 μm, with a spacing of 100 μm therebetween.

Finally, cleavage is carried out so as to set the length of the active region 14 to 300 μm, the length of the phase control region 15 to 100 μm and the length of the DBR region 16 to 300 μm, thereby completing the device of this example.

In the wavelength-tunable semiconductor laser of this example, a variation in the current passed to the DBR region 16 causes a variation in the carrier concentration in the region in which the diffraction grating is provided. This causes a change in refractive index, resulting in a change in the optical period of the diffraction grating and a shift in the oscillation wavelength of the laser.

In the semiconductor laser of this example, fabricated as above, it was possible to vary the oscillation wavelength continuously by 5 nm, under a spectral line width of not more than 1 MHz. The threshold of oscillation was about 10 mA.

Though the diffraction grating was provided on the upper side of the optical waveguide in this example, the diffraction grating may be formed on the lower side of the optical waveguide or in the optical waveguide itself.

While this invention has been explained referring to the Examples above, the invention is effectively applicable to strained-layer superlattices other than those mentioned in the above Examples, namely, to a variety of combinations of an InGaAsP system, an AlGaInAs system and so on. Especially, where the lattice constant of the well layer is greater than the lattice constant of the barrier layer by 0.5 to 4.0%, a remarkable effect is obtainable according to this invention. The substrate is not limited to InP, but may be GaAs or Si. For instance, where a GaAs substrate is used, it is possible to adopt a strained-layer superlattice using a combination of an InGaP well layer and an AlGaAs barrier layer.

Furthermore, this invention is also effective for a system using an antimony compound. For instance, a combination of a well layer based on an InGaAsSb system, a barrier layer based on an GaAlAsSb system and a substrate based on a GaSb compound may be mentioned.

Besides, the conduction type of the substrate may be the p-type; in that case, all the conduction types in each of the above Examples are reversed. The invention is effective also for a structure in which a p-type impurity is added to at least a part of the barrier layer in a high concentration.

Moreover, this invention is also effective for other semiconductor devices, for instance, directional couplers, branching waveguides, waveguide couplers, mode splitters, wavelength filters, wavelength converters, etc. which use a strained-layer superlattice for an optical waveguide. Further, this invention is also applicable to semiconductor lasers using a strained-layer superlattice for an active layer.

As has been described hereinabove, the semiconductor optical device of this invention, with the optical waveguide having a strained-layer superlattice, is capable of restraining the intervalence band absorption in the optical waveguide. When the invention is applied to a carrier injection type optical modulator, therefore, a reduction in transmission loss is achieveable. Also, an application of the invention to a semiconductor laser with external cavity or to a wavelength-tunable semiconductor laser enables a decreased transmission loss and a reduced spectral line width. Furthermore, because a strained-layer superlattice shows a large change in refractive index upon carrier injection, an application of the invention to an optical crosspoint switch ensures a smaller device size and a reduction in crosstalk.

What is claimed is:

1. In a semiconductor optical device comprising an optical waveguide on a semiconductor substrate, the improvement comprising wherein the optical waveguide has a strained-layer superlattice comprising a first semiconductor layer and a second semiconductor layer which are periodically grown, the second semiconductor layer having a narrower band gap and a greater lattice constant as compared with the first semiconductor layer, wherein the lattice constant of the second semiconductor layer is greater than the lattice constant of the first semiconductor layer by a%, the value a being in the range of $0.5 < a < 4.0$ (%).

2. In a semiconductor optical device having a semiconductor laser which comprises, on a semiconductor substrate, an active region having an active layer for emitting light, a wavelength control region having an optical waveguide for conducting the light, the optical waveguide disposed in continuity with the active layer in the optical axis direction, means for injecting a current into the active region, and means for injecting a current into the wavelength control region, the improvement comprising wherein the optical waveguide has a strained-layer superlattice comprising a first semiconductor layer and a second semiconductor layer which are periodically grown, the second semiconductor layer having a narrower band gap and a greater lattice constant as compared with the first semiconductor layer, wherein the lattice constant of the second semiconductor layer is greater than the lattice constant of the first semiconductor layer by a%, the value a being in the range of $0.5 < a < 4.0$ (%).

3. The semiconductor optical device as set forth in claim 2, wherein a diffraction grating is provided on at least one of the upper and lower sides of the active layer.

4. The semiconductor optical device as set forth in claim 2, wherein a diffraction grating is provided on at least one of the upper and lower sides of the optical waveguide, or in the optical waveguide itself.

5. The semiconductor optical device as set forth in claim 1, wherein the first semiconductor layer and/or the second semiconductor layer comprises a III-V compound semiconductor.

6. The semiconductor optical device as set forth in claim 2, wherein the first semiconductor layer and/or the second semiconductor layer comprises a III-V compound semiconductor.

7. The semiconductor optical device as set forth in claim 1, wherein the first semiconductor layer and/or the second semiconductor layer comprises a binary, ternary or quaternary III-V compound semiconductor of an AlGaInAs system or of an InGaAsP system.

8. The semiconductor optical device as set forth in claim 2, wherein the first semiconductor layer and/or the second semiconductor layer comprises a binary, ternary or quaternary III-V compound semiconductor of an AlGaInAs system or of an InGaAsP system.

9. The semiconductor optical device as set forth in claim 1, wherein a p-type impurity is added to a part of the first semiconductor layer.

10. The semiconductor optical device as set forth in claim 2, wherein a p-type impurity is added to a part of the first semiconductor layer.

11. The semiconductor optical device as set forth in claim 1, wherein a p-type impurity is added to an entirety of the first semiconductor layer.

12. The semiconductor optical device as set forth in claim 2, wherein a p-type impurity is added to an entirety of the first semiconductor layer.

13. The semiconductor optical device as set forth in claim 1, wherein the superlattice has a cladding layer on at least one of a side surface and an upper surface thereof.

14. The semiconductor optical device as set forth in claim 2, wherein said active layer for emitting light has a strained-layer superlattice comprising a first semiconductor layer and a second semiconductor layer which are periodically grown, the second semiconductor layer of the superlattice of the active layer having a narrower band gap and a greater lattice constant as compared with the first semiconductor layer of the superlattice of the active layer.

15. The semiconductor optical device as set forth in claim 14, wherein the lattice constant of the second semiconductor layer of the strained-layer superlattice of the active layer is greater than the lattice constant of the first semiconductor layer of the strained-layer superlattice of the active layer by a%, the value a being in the range of $0.5 < a < 4.0$ (%).

16. In a semiconductor optical device having a semiconductor laser which includes an active region having an active layer, the improvement comprising wherein the active layer has a strained-layer superlattice comprising a first semiconductor layer and a second semiconductor layer which are periodically grown, the second semiconductor layer having a narrower band gap and a greater lattice constant as compared with the first semiconductor layer, wherein the lattice constant of the second semiconductor layer is greater than the lattice constant of the first semiconductor layer by a%, the value a being in the range of $0.5 < a < 4.0$ (%).

* * * * *